United States Patent [19]

Tsujii et al.

[11] Patent Number: 4,917,961
[45] Date of Patent: Apr. 17, 1990

[54] METHOD OF PRODUCING CORROSION-, HEAT- AND WEAR-RESISTANT MEMBER, AND THE MEMBER PRODUCED

[75] Inventors: Nobuhiro Tsujii; Genryu Abe; Akira Yamaguchi, all of Hyogo; Minoru Mishuku; Nobujiro Tsuchiya, both of Kanagawa, all of Japan

[73] Assignees: Sanyo Special Steel Co., Ltd.; Fuji Die Co., Ltd., both of Japan

[21] Appl. No.: 393,534

[22] Filed: Aug. 14, 1989

[30] Foreign Application Priority Data

Mar. 6, 1989 [JP] Japan .................................. 64-52088

[51] Int. Cl.$^4$ ............................................... B22F 3/00
[52] U.S. Cl. ..................................... 428/552; 75/246; 419/9; 419/27; 419/28; 428/457; 428/698
[58] Field of Search .................. 75/246; 428/552, 457, 428/698; 419/9, 27, 28

[56] References Cited

U.S. PATENT DOCUMENTS 4,121,927 10/1978 Lohman et al. ...................... 419/33
4,143,208 3/1979 Aslund ................................ 428/558
4,150,196 4/1979 Aslund ................................ 428/558
4,251,273 2/1981 Smith et al. .......................... 75/246
4,808,226 2/1989 Adam .................................. 75/246

Primary Examiner—Stephen J. Lechert, Jr.
Attorney, Agent, or Firm—Klauber & Jackson

[57] ABSTRACT

This invention relates to a method of producing a corrosion-, heat- and wear-resistant member which comprises packing an atomized powder of a high-carbon high-chromium steel into a capsule, heating the capsule packed with the powder, then extruding the capsule packed with the powder to obtain a stock not containing carbide grains greater than 3 $\mu$m, working the stock, polishing a surface of the stock, and evaporating a film of TiC and/or TiN onto the polished surface, and further a corrosion-, heat- and wear-resistant member produced by the method. The corrosion-, heat- and wear-resistant member according to this invention is suitable for being members for tools used under extremely severe conditions, such as various tools for can manufacturing, molding tools for reinforced plastics, etc.

9 Claims, 1 Drawing Sheet

METHOD OF PRODUCING CORROSION-, HEAT- AND WEAR-RESISTANT MEMBER, AND THE MEMBER PRODUCED

BACKGROUND OF THE INVENTION

1. Field of the Invention

This invention relates to evaporation coating of a high-carbon high-chromium steel with carbide or nitride of titanium.

2. Description of the Prior Art

As means for enhancing the wear resistance, corrosion resistance and heat resistance of a metallic material, there is a method of evaporating carbide or nitride of titanium. A coat of titanium carbide or nitride has an extremely high hardness (TiC: Hv 3300–4000, TiN: Hv 1900–2000) as well as corrosion resistance and heat resistance, and is therefore used particularly for reinforced plastic extruder screws, corrosion-, heat- and wear-resistant tools (for instance, forming and guide rolls, powder compacting dies, plastic working tools), etc.

As a parent material to be coated with the carbide or nitride of titanium, a material having a strength suitable for making the most of the hardness of the coating is selected. For corrosion- and wear-resistance use, particularly, a high-carbon high-chromium steel such as JIS SUS440C is used. High-carbon high-chromium steels have sufficient strength and hardness for supporting the above-mentioned coating. When the high-carbon high-chromium steel coated with titanium carbide or nitride is applied to corrosion-resistance use, the steel is capable of preventing the problem that the coated member may become unusable due to fracture of the coating as a result of rapid progrss of corrosion from a broken portion of the coating, because the steel is not so inferior to the coating in corrosion resistance. Conventional materials coated with TiC and/or TiN, however, have difficulties in that the coating will flake or be broken relatively early, and are therefore not satisfactory.

SUMMARY OF THE INVENTION

This invention supplies a steel member provided with a TiC and/or TiN coating thereon and having a long life even with a high-carbon high-chromium steel as a parent material, and means for manufacturing such a steel member.

These and other objects, advantages, features and uses will become more apparent as the description proceeds, when considered with the accompanying drawings.

DESCRIPTION OF THE PREFERRED EMBODIMENTS

The present inventors assumed the reason for the short life of the conventional coating to be the grain size or segregation of carbides in the parent material. Namely, high-carbon high-chromium steels are generally produced by the process of melting→casting→rolling (or forging), like common steels, and the steels thus produced contain a large number of so-called huge eutectic carbide grains segregated in such large size as not to be found in other steels, the huge carbide grains being peculiar to the high-carbon high-chromium systems. It is considered that since the huge eutectic carbide grains are harder than the matrix, upon polishing of the steel member the carbide grains protrude above the polished surface or the protruding carbide grains come off to form recesses in the polished surface, and the coating evaporated thereon also has recessed and protruding portions, so that the protruding portions, particularly, receive impacts from the opponent member brought into contact with the steel member, resulting in fracture.

Figure 2:
FIG. 2 is a similar ×1000 micrograph for a member in which the parent material is a material produced through melting (comparative member).

FIG. 2 shows an actual example of the case. FIG. 2 is a ×1000 micrograph of a cross section of a coat portion of a comparative member having a TiC+TiN double coating on a 400C parent material produced through melting, in which the carbide appears white in the parent material. As seen from the figure, huge carbide grains (about 10 to 15 μm in diameter) protrude from the surface, lifting up the coating. There is a strong possibility that the huge carbide grains will be destroyed by the impact on collision with the opponent member. It is also possible that a stress based on the difference in thermal expansion coefficient between the carbide and the coating at the protruding portion will act on the coating, to accelerate fracture.

To investigate the above-mentioned point, various tests were carried out on parent materials obtained by the following three processes using water-atomized powders and gas-atomized powders of high-carbon high-chromium steels. The atomized powders, solidified through rapid cooling, contained small carbide grains, the average diameter of the carbide grains being about 1 to 2 μm and, even at maximum, rarely exceeding 3 μm. In the materials produced through the process of melting→casting, on the other hand, a large number of huge carbide grains 10 to 30 μm in diameter are present.

The parent materials served to the tests were produced by the four processes: (1) melted and cast material→rolling, (2) powder→press compacting→sintering→HIP (hot isostatic pressing), (3) powder→capsule packing→HIP→drawing (a kind of forging), and (4) powder→capsule packing→glass-lubricated hot extrusion. The parent materials to be tested differing in carbide grain size were prepared by the respective methods, and subjected to coating with carbide or nitride to obtain members to be tested, which were tested.

TABLE 1 shows the chemical compositions of the materials under test, all being JIS SUS440C.

TABLE 1

| Chemical Composition of Materials under Test | | | | | |
|---|---|---|---|---|---|
| Process | C | Si | Mn | Cr | Mo |
| 1: Method and cast material | 1.03 | 0.30 | 0.35 | 16.43 | 0.41 |
| 2: Powder - sintering - HIP | 1.05 | 0.25 | 0.33 | 16.51 | 0.42 |
| 3: Powder - HIP - rolling | 1.02 | 0.27 | 0.37 | 16.50 | 0.42 |
| 4: Powder-extrusion | 1.02 | 0.27 | 0.37 | 16.50 | 0.42 |

The material of Process No. 1, namely, the parent material to be tested prepared from a melted material was obtained by rolling an ingot into a round bar steel of 35 mm diameter, finish working the bar steel to 30 mm diameter, and subjecting the finish-worked bar steel to a heat treatment (1050° C.×20 min.oil cooling→200° C.×1 hr.air cooling) and abrasive finishing.

The parent material under test of Process No. 2 was obtained by compacting a water-atomized powder into a shape of 35 mm in diameter by 300 mm in length by a rubber press, subjecting the compact to 1190° C.×1 hr sintering, subjecting the sintered product to an 1150° C.×1500 atm×1 hr HIP treatment in Ar, and subjecting the thus treated material to a heat treatment and abrasive finishing in the same manner as in No. 1.

The parent material under test of Process No. 3 was obtained by packing a nitrogen gas-atomized powder into a mild steel sheet-made capsule 150 mm in diameter by 500 mm in length, subjecting the packed powder to the same HIP treatment as in No. 2, and subjecting the thus treated product to drawing (a kind of forging) to obtain a round bar 35 mm in diameter and to the same subsequent treatment as in No. 1.

The parent material of Process No. 4 was obtained by packing a nitrogen gas-atomized powder into a mild steel sheet-made capsule 150 mm in diameter by 600 mm in height, heating the packed powder to 1030° C., then immediately extruding the capsule packed with the powder by a 2000-t horizontal extrusion press to obtain a round rod 35 mm in diameter, and subjecting the extrudate to the same subsequent treatment as in No. 1.

For each of the parent materials relevant to the above processes, a large number of parent materials to be tested were prepared, part of which were served to material tests on the parent materials, another part were provided with an about 3.5 μm thick coating of TiC by the CVD (chemical vapor deposition) method, and the remainder were provided with a double coating of TiC+TiN(about 2.0+1.5 μm thick) by the CVD method. The same finish heat treatment as that for the parent materials under test was then carried out to obtain members to be tested.

On each of the members under test prepared as above, endurance life tests of the coating were carried out by a roller pitting method using at least 10 specimens each. The test results are shown in TABLE 2.

pared from powder are extremely small, 6 to 2 μm. Particularly, in the parent material of No. 4 according to the method of this invention, there is observed no carbide grain greater than 3 μm. In the parent materials of No. 2 and No. 3, there are observed some carbide grains 5 to 6 μm in size formed through growth during the HIP treatment.

As to the deflective strength of the parent materials under test, the parent material of No. 4 is the highest both in radial direction and in axial direction, the parent material of No. 3 is the second highest, and the parent materials of No. 1 and No. 2 are low. The low deflective strength (particularly in radial direction) of the parent material of No. 1 is considered to be due to the extremely coarse carbides, as compared to the carbides in the other parent materials. The reason for the low deflective strength of the parent material of No. 2 is considered to be that, since Process No. 2 comprises only the sintering→HIP treatment and does not comprise rolling or forging, the density of the parent material is less than 100% due to the presence of pores (voids), which are generally observed in materials prepared by this process. In the case of No. 4, the absence of the pores, which are liable to be formed in powder products, is also a great feature.

Referring now to the results of the roller pitting test on the coated members under test, thought most of in this invention, the member of Process No. 4 showed a long life, about 3 to 8 times those of the members of the other processes. The member of No. 3, with the maximum carbide diameter of 5 μm and with the density of approximately 100% due to the rolling after the HIP treatment, showed a life equal to about one-third of the life of the member of No. 4. This shows that the critical value of the maximum carbide grain size associated with the generation of the difference in life lies in the range of 3 to 5 μm.

As has been described above, the members under test containing carbide grains exceeding 3 μm in size, namely, the members of Process Nos. 1 to 3 did not give satisfactory results, and only the member with a maximum carbide grain diameter of not more than 3 μm according to Process No. 4 gave satisfactory results. It

TABLE 2

| No. | Production process for patent material | Maximum carbide grain size after quenching and tempering (μm) | Deflective strength before coating (kgf/mm$^2$) | | Kind of coating (CVD) method | Film thickness of coating (μm) | Roller pitting life B$_{10}$Life |
|---|---|---|---|---|---|---|---|
| | | | Radial direction | Axial direction | | | |
| 1 | Melting → casting → rolling (prior art method) | 24 | 183 | 289 | TiC | 3.5 | 2.5 × 10$^6$ cycles |
| | | | | | TiC + TiN | 2.0 + 1.5 | 2.7 × 10$^6$ |
| 2 | Powder (water) → press compacting → sintering → HIP (comparative method) | 6 | 230 | 232 | TiC | 3.5 | 4.9 × 10$^6$ |
| | | | | | TiC + TiN | 2.0 + 1.5 | 5.4 × 10$^6$ |
| 3 | Powder (gas) → capsule packing → HIP → rolling (comparative method) | 5 | 225 | 368 | TiC | 3.5 | 6.2 × 10$^6$ |
| | | | | | TiC + TiN | 2.0 + 1.5 | 6.9 × 10$^6$ |
| 4 | Powder (gas) → capsule packing → hot extrusion (method of this invention) | 2 | 298 | 391 | TiC | 3.5 | 1.6 × 10$^7$ |
| | | | | | TiC + TiN | 2.0 + 1.5 | 2.1 × 10$^7$ |

As shown in TABLE 2, the maximum carbide grain diameter in the parent material under test is 24 μm for Process No. 1 with the parent material prepared through melting, whereas the maximum carbide grain diameters for Nos. 2 to 4 with the parent materials prepared from powder are extremely small, 6 to 2 μm.

has also been confirmed that only Process No. 4, comprising packing the powder into a capsule followed by hot extrusion, makes it possible to maintain the diameter of the carbide grains. Namely, when a powder is used and a method other than Process No. 4 is used with the intension of maintaining a small carbide grain diameter by inhibiting aggregation or growth of the carbide grains, it is inevitable to reduce a thermal history applied. In that case, it is impossible to obtain a 100% density, and the strength of the material itself becomes low, resulting in that the material obtained is unsuitable for use as a parent material.

Figure 1:
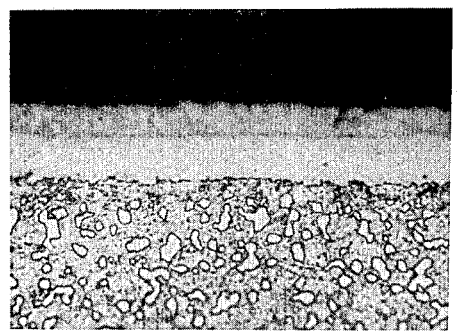
FIG. 1 is a ×3000 micrograph showing the metallic structure of a cross section of a coat portion of a corrosion- and wear-resistant member according to this invention.

FIG. 1 shows a ×3000 micrograph of a cross section of the coating of the double-coated member obtained by Process No. 4 according to the method of this invention. In the parent material portion, there is not observed any carbide grain exceeding 3 μm in size, and the coating is extremely smooth. The surface of the double-coated member is free of recessed or protruding portions due to huge carbide grains, which are seen in the coating on the parent material consisting of conventional materials of FIG. 2 above.

As has been described above, it was found out that in order to deposit a satisfactory titanium carbide or nitride film on a high-carbon high-chromium steel by evaporation, the maximum diameter of chromium carbide grains in the parent material should be not more than 3 μm. It was also found out that in order to obtain such a parent material, it is most suitable to pack an atomized powder in a capsule and subject the powder-packed capsule to glass-lubricated hot extrusion. This invention has been attained based on the findings.

WORKING EXAMPLES

TABLE 3 shows examples of chemical composition.

TABLE 3
Examples of Chemical Composition (wt %)

| No. | C | Si | Mn | Cr | Mo | V | W | Nb | Co |
|---|---|---|---|---|---|---|---|---|---|
| 1 | 1.05 | 0.35 | 0.38 | 16.20 | — | — | — | — | — |
| 2 | 1.95 | 0.58 | 0.23 | 24.05 | — | — | — | — | — |
| 3 | 1.02 | 0.27 | 0.37 | 16.50 | 0.42 | — | — | — | — |
| 4 | 1.80 | 0.31 | 0.45 | 20.20 | 3.04 | — | — | — | — |
| 5 | 0.85 | 0.33 | 0.68 | 15.30 | — | 1.01 | — | — | — |
| 6 | 1.32 | 0.55 | 0.27 | 17.50 | — | — | — | 1.24 | — |
| 7 | 1.55 | 0.62 | 0.31 | 18.20 | — | — | 3.01 | — | — |
| 8 | 1.88 | 0.60 | 0.28 | 21.05 | — | — | — | — | 3.54 |
| 9 | 1.75 | 0.45 | 0.35 | 18.03 | 1.00 | — | — | — | 2.02 |
| 10 | 1.95 | 0.55 | 0.24 | 23.01 | — | — | 2.05 | 0.80 | 1.00 |
| 11 | 1.94 | 0.22 | 0.41 | 17.21 | 1.05 | 0.50 | — | 0.07 | 2.01 |
| 12 | 1.95 | 0.30 | 0.35 | 17.55 | 0.98 | 0.49 | 1.01 | 0.06 | 1.45 |

EXAMPLE 1

Of a gas-atomized powder of Composition No. 3 (corresponding to SUS440C) in TABLE 3, a minus 35 mesh portion (about 500 μm or below) was packed in a mild steel sheet-made capsule to prepare a billet 205 mm in diameter by 600 mm in length. The billet was heated to 1030° C., and then extruded by a 2000-t extrusion press at an extrusion pressure of 150 kgf/mm² to produce a bar stock of 65 mm diameter. The bar stock was worked, quenched from 1050° C. and subjected to 200° C. tempering. The thus treated bar stock was polished, coated with TiC by CVD and subjected to a further similar heat treatment to produce a roll. When the roll thus obtained was used as a guide roll for wire rod, the life of the roll was about 2000 hr. On the other hand, a roll produced similarly from a conventional material prepared through melting showed flaking of the coat after about 1000 hr of use as a guide roll. Thus, the member obtained according to this invention showed a life improved to about 2 times as compared to the life of the corresponding member according to the prior art.

EXAMPLE 2

A gas-atomized powder of Composition No. 4 in TABLE 3 was used to produce the same type of roll member as in Example 1 in the same manner as in Example 1. When the roll member was served to the practical operation test, the life of the roll member was 2500 hr, about 2.5 times the life of the conventional roll member prudced from a melted material. This improvement in life is considered to arise from the improved adhesion between the coating and the parent material due to the extremely high hardness, HRC 63, of the parent material (in the case of Example 1, HRC 59) as a result of the higher-C, higher-Cr and higher-Mo composition as compared to SUS440C.

EXAMPLE 3

A gas-atomized powder of Composition No. 10 in TABLE 3 was used to produce a bar stock 80 mm in diameter in the same manner as in Example 1. The bar stock was worked to produce an extruder screw for a reinforced plastic having a high silica content. The screw was coated with TiC in a thickness of 3.5 to 4.0 μm, quenched from 1070° C., and subjected to 250° C. tempering and to final polishing, to obtain a product for a practical operation test. The life of the screw shown upon the test was 1.8 times the life of a screw produced from a melted SUS440C material by a predetermined heat treatment and the above-mentioned TiC coating treatment, and was 1.5 times the life of a screw formed from Ferrotic, which is the material frequently used for such screws. For all of the three kinds of extruder screws, the end of the life was due to lowering in the extrusion pressure as a result of wear of the screw. The longer life of the screw of this example as compared to the life of the screw produced from the melted SUS440C material is considered to be due to the improvements in the adhesion of the coat and in the ruggedness of the surface.

EXAMPLE 4

A gas-atomized powder of Composition No. 7 in TABLE 7 was used to produce a gate part (die) of a molding machine for a reinforced plastic having a high silica content. The production conditions were the same as in Example 3. Upon a practical operation test, the gate part showed a life of about 2.1 times the life of a gate part produced from a melted SUS440C material. While the gate part produced from the melted material came to the end of life through local uneven wear, the gate part obtained according to this invention came to the end of life through uniform wear. The difference in life between the two kinds of gate parts is considered to arise from the lowered adhesion of the coating on the conventional gate part due to the ununiformity of the structure of the parent material prepared through melting, and from a reduction in film thickness at protruding portions of the coating, and the resultant flaking, during the use of the conventional gate part.

EXAMPLE 5

A gas-atomized powder of Composition No. 5 in TABLE 3 was used to produce a bar stock under the same conditions as in Example 1. The bar stock was worked, quenched from 1050° C., subjected to 200° C.

tempering, then polished, coated with TiC+TiN, and again subjected to heat treatment and polishing under the same conditions as above to produce a throat for a beer bottle capping machine. When served to a practical operation test, the throat showed a longer life of about 7 months, as compared to the life of about 3 months of a throat produced from a melted SUS440C material. The throat produced from the melted material showed flaking at a large number of portions of the coat, accompanying longitudinal flaws in the introducing portion (approach) of the throat. On the other hand, the throat produced according to this invention showed uniform wear, probably because of the absence of recessed or protruding portions which, if present, would give rise to stress concentration.

EXAMPLE 6

A gas-atomized powder of Composition No. 2 in TABLE 3 was used to produce a bar stock under the same conditions as in Example 1. The bar stock was worked, quenched from 1130° C., subjected to 200° C. tempering, then polished, coated with TiC+TiN, and again subjected to heat treatment and polishing under the same conditions as above to produce a seamer roll for can manufacturing. In consideration of the severe use conditions of the seamer roll and in order to make clear the difference between the member produced according to this invention and a member produced from a melted material, 12 rolls each were produced from the two kinds of materials, and were used as cap seamer rolls for beverage cans to perform a practical operation test. The rolls produced according to this invention were found able to seam an average of 1,500,000 cans, whereas the rolls produced from the melted material were found able to seam an average of 800,000 cans. Of the 12 rolls produced from the melted material, three were broken after seaming 350,000 cans, 480,000 cans and 690,000 cans, respectively. On the other hand, none of the rolls produced according to this invention were broken, and each of the rolls has a life of at least 1,200,000 cans. An investigation of the fracture surfaces of the broken rolls produced from the melted material revealed that the origin of the fracture was coarse carbide grains 20 to 30 μm in size, for all the three broken rolls. Besides, eight of the 12 rolls produced from the melted material showed partial flaking of the coating, and, as a result of corrosion in part of the parent material, came to the end of life. On the other hand, eleven of the 12 rolls produced according to the invention showed uniform wear, and only one of the rolls showed local pit-like flawing. These results indicate the excellent strength of the parent material in the rolls produced according to this invention as well as superior adhesion between the parent material and the coating.

As has been described above, according to this invention it is possible to deposit a satisfactory film of TiC and/or TiN on a high-carbon high-chromium steel by evaporation, which has not hitherto been achievable. The invention was applied, by way of example, to members used under extremely severe conditions, such as various tools for can manufacturing, molding tools for reinforced plastics, etc., whereby it was possible to enhance the reliability and useful life of the equipment employing the members.

What is claimed is:

1. A method of producing a corrosion-, heat- and wear-resistant member which comprises packing an atomized powder of a high-carbon high-chromium steel containing, in % by weight, 0.8 to 2.0 of C, 0.05 to 1.00 of Si, 0.05 to 1.00 of Mn, 15 to 25 of Cr, optionally 0.05 to 4.0 of at least one selected from Mo, V, Nb, W and Co, the balance being iron, into a capsule, heating the capsule packed with the powder, then extruding the capsule packed with the powder to obtain a stock not containing carbide grains greater than 3 μm, working the stock, polishing a surface of the stock, and evaporating a film of TiC and/or TiN onto the polished surface.

2. The method of producing a corrosion-, heat- and wear-resistant member described in claim 1 which is characterized by evaporating a film of TiC and/or TiN by the CVD chemical vaporization deposition method.

3. A corrosion-, heat- and wear-resistant member produced by the method as set forth in claim 1 or 2.

4. A guide roll for wire rod produced from the corrosion-, heat- and wear-resistant member as set forth in claim 3.

5. An extruder screw for a reinforced plastic produced from the corrosion-, heat- and wear-resistant member as set forth in claim 3.

6. A gate part of a molding machine for a reinforced plastic produced from the corrosion-, heat- and wear-resistant member as set forth in claim 3.

7. A throat for a beer bottle cappling machine produced from the corrosion-, heat- and wear-resistant member as set forth in claim 3.

8. A seamer roll for can manufacturing produced from the corrosion-, heat- and wear-resistant member as set forth in claim 3.

9. Powder compacting dies produced from the corrosion-, heat- and wear-resistant member as set forth in claim 3.

* * * * *